US006747852B2

(12) United States Patent
Lin et al.

(10) Patent No.: US 6,747,852 B2
(45) Date of Patent: Jun. 8, 2004

(54) MAGNETORESISTANCE SENSORS WITH PT-MN TRANSVERSE AND LONGITUDINAL PINNING LAYERS AND A DECOUPLING INSULATION LAYER

(75) Inventors: Tsann Lin, Saratoga, CA (US); Daniele Mauri, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 278 days.

(21) Appl. No.: 09/932,620

(22) Filed: Aug. 17, 2001

(65) Prior Publication Data

US 2003/0035253 A1 Feb. 20, 2003

(51) Int. Cl.[7] .................................................. G11B 5/39
(52) U.S. Cl. .................................................. 360/324.12
(58) Field of Search ........................ 360/324.12, 324.2, 360/126, 324, 314, 319; 428/611

(56) References Cited

U.S. PATENT DOCUMENTS

| 5,041,147 | A | | 8/1991 | Knize et al. ............... 55/179 |
| 5,315,468 | A | | 5/1994 | Lin et al. .................. 360/113 |
| 5,329,413 | A | | 7/1994 | Kondoh et al. ............. 360/113 |
| 5,436,778 | A | | 7/1995 | Lin et al. .................. 360/113 |
| 5,461,527 | A | | 10/1995 | Akiyama et al. ........... 360/113 |
| 5,668,523 | A | | 9/1997 | Chen et al. ............... 338/32 R |
| 5,729,410 | A | | 3/1998 | Fontana, Jr. et al. ........ 360/113 |
| 5,742,162 | A | | 4/1998 | Nepela et al. ............. 324/252 |
| 5,910,344 | A | | 6/1999 | Hasegawa et al. .......... 427/599 |
| 5,933,297 | A | | 8/1999 | Hoshiya et al. ............ 360/113 |
| 6,023,395 | A | * | 2/2000 | Dill et al. ................. 360/324.2 |
| 6,055,136 | A | * | 4/2000 | Gill et al. ................. 360/314 |
| 6,074,767 | A | | 6/2000 | Lin .......................... 428/692 |
| 6,090,498 | A | | 7/2000 | Omata et al. .............. 428/692 |
| 6,259,586 | B1 | * | 7/2001 | Gill ......................... 360/324.2 |
| 6,275,363 | B1 | * | 8/2001 | Gill ......................... 360/324.2 |
| 6,341,053 | B1 | * | 1/2002 | Nakada et al. ............. 360/324.2 |
| 6,396,669 | B1 | * | 5/2002 | Gill ......................... 360/319 |
| 6,407,890 | B1 | * | 6/2002 | Gill ......................... 360/314 |
| 6,542,341 | B1 | * | 4/2003 | Carey et al. ............... 360/324 |
| 6,630,248 | B1 | * | 10/2003 | Horng et al. .............. 428/611 |
| 2003/0002231 | A1 | * | 1/2003 | Dee ......................... 360/324.12 |

FOREIGN PATENT DOCUMENTS

| JP | 9251619 | 9/1997 |
| JP | 11273034 | 10/1999 |

* cited by examiner

Primary Examiner—Tianjie Chen
(74) Attorney, Agent, or Firm—Silicon Valley IP Group, PC; Dominic M. Kotab

(57) ABSTRACT

A magnetoresistance sensor structure is formed of a magnetoresistance sensor having a transverse biasing stack including a transverse pinning layer made of a transverse-pinning-layer antiferromagnetic material, and a transverse pinned layer structure overlying the transverse pinning layer, a spacer layer overlying the transverse pinned layer structure, a sensing stack overlying the spacer layer, and a decoupling layer overlying the sensing stack. A longitudinal biasing stack overlies the magnetoresistance sensor and includes a longitudinal pinned layer, and a longitudinal pinning layer overlying the longitudinal pinned layer and made of a longitudinal-pinning-layer antiferromagnetic material. The transverse-pinning-layer antiferromagnetic material and the longitudinal-pinning-layer antiferromagnetic material are preferably Pt—Mn or Ni—Mn.

13 Claims, 11 Drawing Sheets

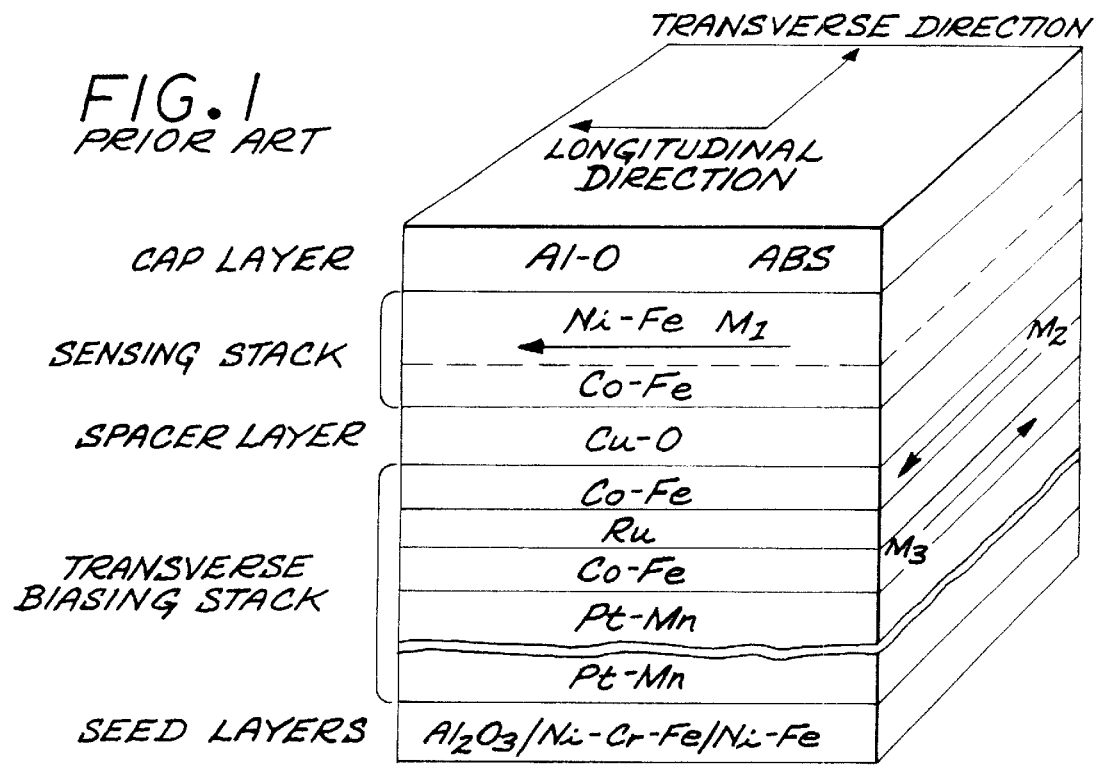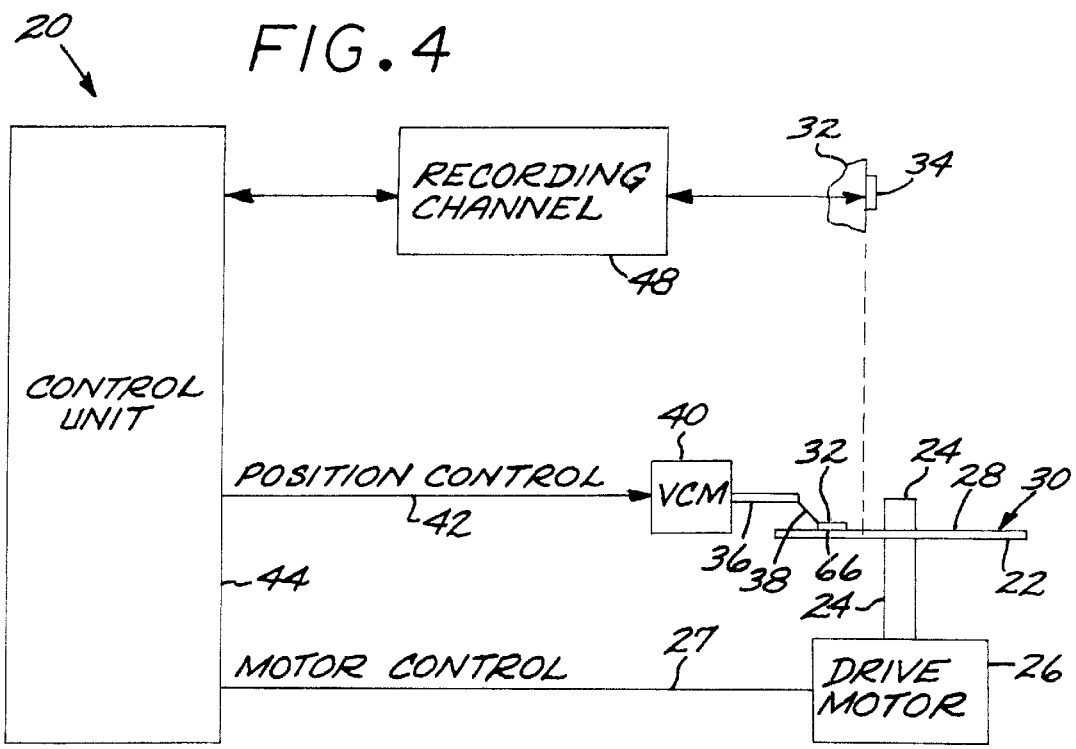

US 6,747,852 B2

MAGNETORESISTANCE SENSORS WITH PT-MN TRANSVERSE AND LONGITUDINAL PINNING LAYERS AND A DECOUPLING INSULATION LAYER

This invention relates to a structure of a magnetoresistance (MR) sensor overlaid with a longitudinal biasing (LB) stack in a read region and the fabrication method of this structure and, more particularly, to the transverse and longitudinal pinning layers used in the MR sensor and the LB stack, respectively.

BACKGROUND OF THE INVENTION

A magnetoresistance (MR) sensor is used in a read/write head to read magnetic fields on a recording medium of a magnetic storage device. An example is the read/write head of a computer hard disk or a magnetic recording tape. The read/write head is positioned closely adjacent to the recording medium, separated from the recording medium by an air bearing surface (ABS) that does not allow them to touch. A data bit is written onto an area of the recording medium using the writing portion of the read/write head by locally changing its magnetic state. That magnetic state is later sensed by the MR sensor to read the data bit.

Two known types of MR sensors are a giant magnetoresistance (GMR) sensor and a tunnel magnetoresistance (TMR) sensor. The general technical basis, construction, and operation of the GMR sensor are described, for example, in U.S. Pat. No. 5,436,778. The general technical basis, construction, and operation of the TMR sensor are described, for example, in U.S. Pat. No. 5,729,410. The disclosures of both patents are incorporated by reference in their entireties. These patents also describe the read/write heads and the magnetic storage systems.

The structure of the MR sensors, such as the GMR sensor or TMR sensor, includes two thin-film stacks separated by an intermediate nonmagnetic film used as a spacer layer. FIG. 1 illustrates one form of a conventional MR sensor, with a Cu—O spacer layer separating the two thin-film stacks. The first thin-film stack, referred to as the transverse biasing (TB) stack, includes layers above the seed layers and below the Cu—O spacer layer (FIG. 1). In this TB stack, two magnetizations ($M_2$ and $M_3$) are separated by a ruthenium (Ru) spacer layer, and are rigidly pinned by a transverse pinning layer in two directions lying the plane of the MR sensor and perpendicular to the ABS. The second thin-film stack, referred to as the sensing stack, includes layers above the Cu—O layer and below a cap layer (FIG. 1). In this sensing stack, the magnetization is biased in a longitudinal direction lying in the plane of the MR sensor and parallel to the ABS.

A transverse pinning layer and a longitudinal biasing structure are provided to maintain the mutually perpendicular orientations of these magnetizations. The transverse pinning layer, the Pt—Mn film in FIG. 1, is positioned adjacent to the lower ferromagnetic film in the transverse biasing stack. (The lower ferromagnetic film is referred to as a keeper layer, whose magnetization $M_3$ partially cancels the magnetization $M_2$ of the upper ferromagnetic film, which is referred to as the reference layer.) The longitudinal biasing structure may be positioned either at two edges of the MR sensor as in FIG. 2, or adjacent to the sensing stack only in two side regions as in FIG. 3, thereby longitudinally biasing the sensing stack in the read region for sensor stability. The transverse pinning layer is typically made of an antiferromagnetic (AFM) film, while the longitudinal biasing structure is typically made of either a hard magnetic (HM) film with a suitable seed layer for the MR sensor structure as shown in FIG. 2, or another antiferromagnetic film for the MR sensor structure as shown in FIG. 3.

The use of the hard magnetic film as the longitudinal biasing structure causes a reduction in the available sensing area due to magnetic stiffness at the two edges of the MR sensor, thereby decreasing the read efficiency. These edge effects are a major problem as the MR sensor is made smaller. In addition, the required magnetic moment of the hard magnetic film is typically more than six times that of the sensing stack, resulting in low signal sensitivity of the MR sensor. On the other hand, the use of another antiferromagnetic film as the longitudinal biasing structure leads to concerns regarding the feasibility of maintaining the mutually perpendicular magnetization orientations and regarding corrosion resistance.

As magnetic storage devices are developed with increasing densities of stored data and relative speeds of movement of the recording media, their operating temperatures are increased as well. The required operating temperatures of the MR sensors are now in excess of about 180° C., and may be expected to rise even further. There is a need for a pinning approach that rigidly pins the magnetizations at these elevated temperatures as well as at lower temperatures, and also exhibits acceptable corrosion resistance. The present invention fulfills this need, and further provides related advantages.

SUMMARY OF THE INVENTION

The present invention provides a magnetoresistance (MR) sensor structure useful to read magnetic fields, and a fabrication method for this MR sensor structure. In the MR sensor, transverse and longitudinal pinning layers are made of an antiferromagnetic material, preferably Pt—Mn. The MR sensor structure is stable at high operating temperatures and has good corrosion resistance. Good flux closure is formed between the sensing stack and the longitudinal biasing stack. The required magnetic moment of the longitudinal biasing stack generally matches that of the sensing stack, resulting in high signal sensitivity of the sensor. The present approach may be used for different types of MR sensor structures, such as a giant magnetoresistance sensor and a tunnel magnetoresistance sensor.

In accordance with the invention, a magnetoresistance sensor structure comprises a magnetoresistance sensor having a sensor surface plane, a transverse direction lying in the sensor surface plane, and a longitudinal direction lying perpendicular to the transverse direction and in the sensor surface plane. The magnetoresistance sensor comprises a transverse biasing stack comprising a transverse pinning layer made of a transverse-pinning-layer antiferromagnetic material, and a transverse pinned layer structure overlying the transverse pinning layer. The magnetoresistance sensor further comprises a spacer layer overlying the transverse pinned layer structure, a sensing stack overlying the spacer layer, and a decoupling layer overlying the sensing stack. A longitudinal biasing stack overlies the magnetoresistance sensor. The longitudinal biasing stack comprises a longitudinal pinned layer and a longitudinal pinning layer overlying the longitudinal pinned layer and made of a longitudinal-pinning-layer antiferromagnetic material. Preferably, there is also a seed layer upon which the transverse biasing stack is deposited, and a cap layer overlying the longitudinal biasing stack.

The transverse pinned layer structure is rigidly pinned magnetically in the transverse direction by the transverse pinning layer at temperatures of from room temperature to at least 180° C., and the longitudinal pinned layer is rigidly pinned magnetically in the longitudinal direction by the longitudinal pinning layer at temperatures of from room temperature to at least 180° C. The magnetoresistance sensor may be of any operable type, such as a giant magnetoresistance sensor or a tunnel magnetoresistance sensor.

The transverse-pinning-layer antiferromagnetic material is preferably selected from the group consisting of Pt—Mn and Ni—Mn, and the longitudinal-pinning-layer antiferromagnetic material is selected from the group consisting of Pt—Mn and Ni—Mn. The transverse-pinning-layer antiferromagnetic material and the longitudinal-pinning-layer antiferromagnetic material may be the same material, and are most preferably both Pt—Mn.

A method for fabricating a magnetoresistance sensor structure comprises the step of forming a magnetoresistance sensor having a sensor surface plane, a transverse direction lying in the sensor surface plane, and a longitudinal direction lying perpendicular to the transverse direction and in the sensor surface plane. The step of forming the magnetoresistance sensor comprises the steps of depositing a transverse biasing stack comprising a transverse pinning layer made of a transverse-pinning-layer antiferromagnetic material, and a transverse pinned layer structure overlying the transverse pinning layer, depositing a spacer layer overlying the transverse pinned layer structure, depositing a sensing stack overlying the spacer layer, and depositing a decoupling layer overlying the sensing stack. Thereafter the magnetoresistance sensor is first annealed at a first annealing temperature and in a transverse first applied magnetic field to develop antiferromagnetism in the transverse pinning layer and to rigidly pin a magnetization of the transverse pinned layer in the transverse direction. A longitudinal biasing stack is thereafter formed overlying the magnetoresistance sensor. The step of forming the longitudinal biasing stack comprises the steps of depositing a longitudinal pinned layer, and depositing a longitudinal pinning layer overlying the longitudinal pinned layer and made of a longitudinal-pinning-layer antiferromagnetic material. Thereafter, the magnetoresistance sensor and the longitudinal biasing stack are second annealed at a second annealing temperature and in a longitudinal second applied magnetic field, to develop antiferromagnetism in the longitudinal pinning layer and to pin a magnetization of the longitudinal pinned layer in the longitudinal direction. The step of second annealing does not disrupt the magnetization of the transverse pinned layer structure.

In this method, the first annealing temperature is preferably from about 240° C. to about 280° C. and the transverse first applied magnetic field is from about 7.5 kOe to about 15 kOe. The second annealing temperature is preferably from about 220° C. to about 260° C. and the longitudinal second applied magnetic field is from about 10 Oe to about 1000 Oe.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIG. 1 is a schematic diagram of a magnetoresistance sensor with a Pt—Mn transverse pinning layer in the read region;

FIG. 4 is a schematic diagram of a magnetic disk data storage system;

DETAILED DESCRIPTION OF THE INVENTION

Figure 2:
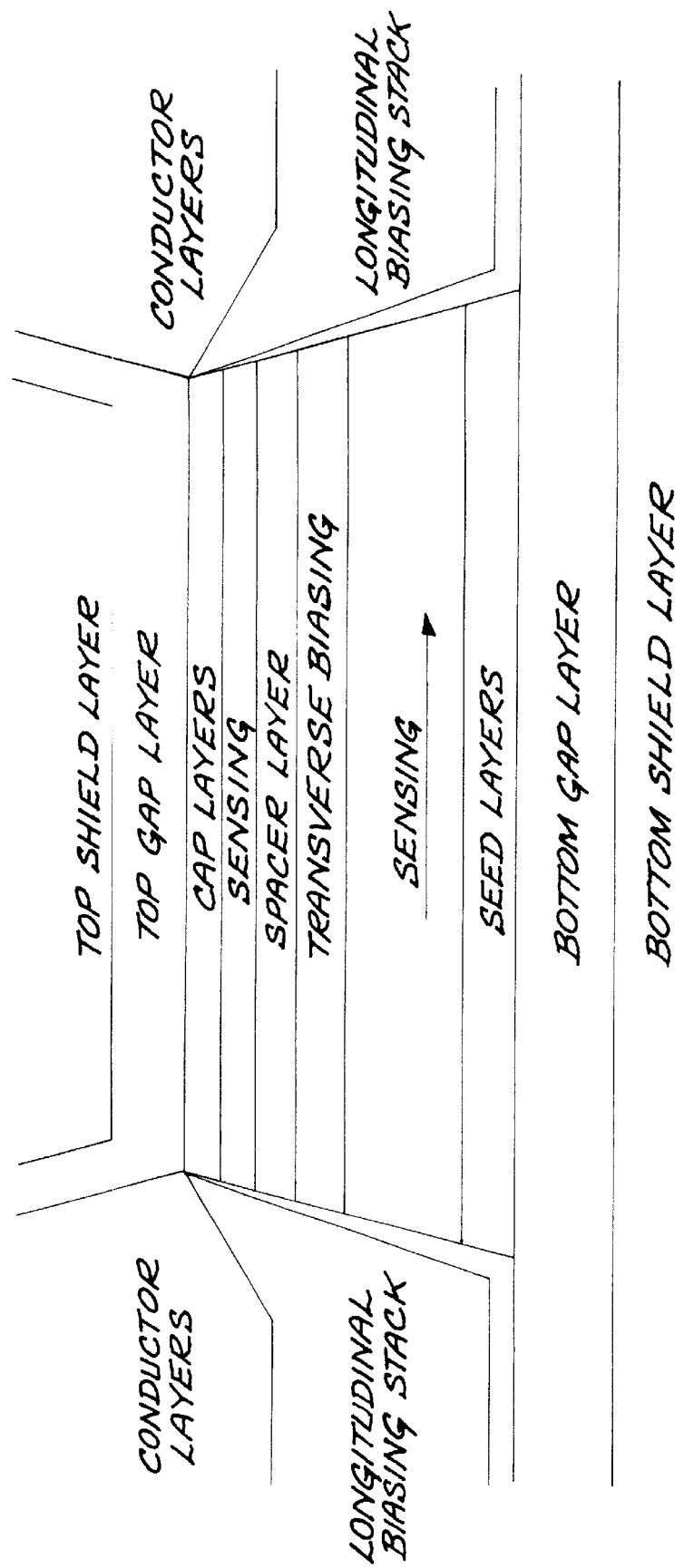
FIG. 2 is a schematic diagram of a giant magnetoresistance sensor with a Pt—Mn transverse pinning layer in the read region and with a Co—Pt—Cr longitudinal biasing structure in the two side regions.

FIG. 4 shows a data storage system, here depicted as a magnetic disk drive system 20, with which the present approach may be used. The magnetic disk drive system 20 includes a rotatable magnetic storage disk 22 that is supported on a spindle 24 and rotated by a disk drive motor 26 under motor control 27 of a control unit 44. A magnetic storage medium 28 is deposited on a surface 30 of the magnetic storage disk 22.

A slider 32 is positioned in facing relation to the magnetic storage disk 22. The slider 32 supports at least one read/write head 34 in facing relation to the magnetic storage medium 28 of the magnetic storage disk 22. The slider 32 is mounted to an actuator arm 36 by a suspension 38. The actuator arm 36 and the slider 32 move radially inwardly and outwardly so that the combined inward/outward motion of the slider 32 and the rotation of the magnetic storage disk 22 allows the read/write head to be placed into facing relation to the entire area of the magnetic storage medium. The actuator arm 36 is driven by an actuator 40 (depicted as a voice coil motor or VCM) under the radial position control 42 of the control unit 44.

The suspension 38 generates a slight spring force which biases the slider 32 toward the surface 30 of the magnetic storage disk 22. During sensor operation the magnetic storage disk 22 turns, and an air bearing is created between the downwardly facing surface of the slider 32, termed the air bearing surface 46 or ABS, and the upwardly facing surface 30 of the magnetic storage disk 22. (Only the downwardly oriented slider is illustrated, but there may also or instead be an upwardly oriented slider facing the bottom side of the magnetic storage disk.) The air bearing counterbalances the slight spring force of the suspension 38 and supports the slider 32 a small distance above the surface 30 with a small, substantially constant separation.

The read/write head 34 writes data onto the magnetic storage medium 28 by altering magnetic states in the magnetic storage medium, and also reads data from the magnetic storage medium 28 by sensing the magnetic states in the magnetic storage medium 28. The writing and reading commands, as well as the data to be written or read, is transmitted between the control unit 44 and the read/write head 34 over a recording channel 48. The present approach is concerned with the magnetoresistance (MR) sensor that is part of the read/write head 34.

The preceding discussion is a simplified description of the data storage system in the form of the magnetic disk drive system 20, to set the environment in which the present invention is used. The present invention is also applicable to other types of magnetic data storage systems such as tape drives and their read/write heads.

Figure 5:
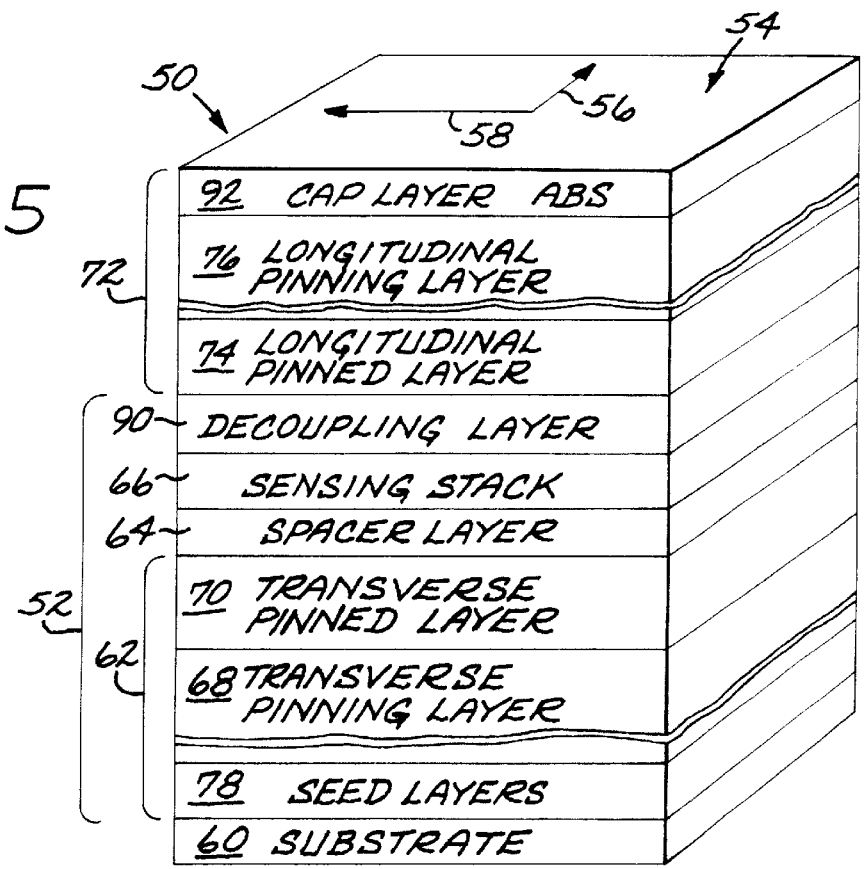
FIG. 5 is a schematic diagram of a magnetoresistance sensor with Pt—Mn transverse and longitudinal pinning layers in the read region.

FIG. 5 shows a portion of a magnetoresistance (MR) sensor structure 50 included in the read/write head 34 of the magnetic disk drive system 20. The MR sensor structure 50 includes an MR sensor 52. The MR sensor structure 50 is made of a series of layers or films that are very thin in relation to their lateral extent. (The figures herein are not drawn to scale.) To establish a frame of reference, the MR sensor structure 50 may be described as having a sensor surface plane 54, a transverse direction 56 lying in the sensor surface plane 54 and perpendicular to and away from the ABS, and a longitudinal direction 58 lying in the sensor surface plane 54 and perpendicular to the transverse direction 56. When the MR sensor 52 is assembled into the read/write head 34, the transverse direction 56 is perpendicular to the air bearing surface (ABS) 46 and thence to the surface 30 of the magnetic storage disk 22.

The MR sensor 52 is deposited on a substrate 60. The MR sensor 52 includes seed layers 78 deposited upon the substrate 60, a transverse biasing stack 62 deposited upon the seed layers 78, a spacer layer 64 deposited upon the transverse biasing stack 62, a sensing stack 66 deposited upon the spacer layer 64, and a decoupling layer 90 deposited upon the sensing stack 66. The transverse biasing stack 62 includes a transverse pinning layer 68 made of an antiferromagnetic material which may be either Pt—Mn or Ni—Mn (preferably Pt—Mn), and a transverse pinned layer structure 70 overlying the transverse pinning layer 68. "Overlying" as used herein means that the two elements are in facing relation to each other on their broad faces and in contact directly or through other films that may be present for reasons of deposition or otherwise. A longitudinal biasing (LB) stack 72 overlies the MR sensor 52. The longitudinal biasing stack 72 includes a longitudinal pinned layer 74 and a longitudinal pinning layer 76 deposited upon the longitudinal pinned layer 74. The longitudinal pinning layer 76 is made of a longitudinal-pinning-layer antiferromagnetic material in the form of a film such as Pt—Mn or Ni—Mn. The longitudinal biasing stack 72 is in situ protected by a cap layer 92.

Figure 6:
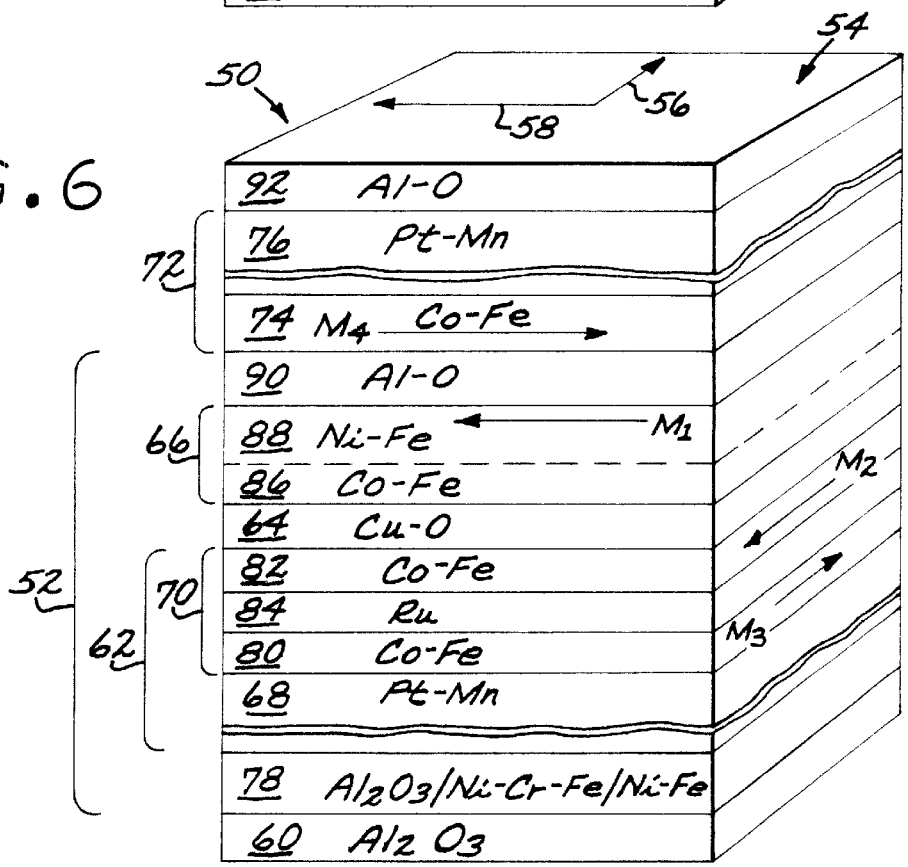
FIG. 6 is a schematic diagram of a preferred form of the magnetoresistance sensor of FIG. 5.

FIG. 6 depicts a preferred form of the MR sensor structure 50 of FIG. 5. The preferred materials of construction are indicated, although the invention is not so limited. The substrate 60 is preferably an $Al_2O_3$-coated wafer. Overlying and contacting the substrate 60 are seed layers 78 that facilitate the growth of the overlying layers with preferred structures. The preferred seed layers 78 are a first layer of $Al_2O_3$ overlying and contacting the substrate 60, a second layer of Ni—Cr—Fe overlying and contacting the first layer, and a third layer of Ni—Fe overlying and contacting the second layer.

The transverse pinning layer 68 overlies and contacts the seed layers 78. The magnetic moments in the transverse pinning layer 68 are alternatively aligned in two directions perpendicular to the ABS, but cancel each other so that there is no net magnetization in the transverse pinning layer 68. The transverse pinning layer 68 is made of an antiferromagnetic film of Pt—Mn or Ni—Mn, with Pt—Mn preferred, of approximately equiatomic composition. The transverse pinning layer 68 rigidly pins the two magnetizations of the transverse pinned layer structure 70 to lie parallel to the transverse direction 56.

The transverse pinned layer structure 70 overlies and contacts the transverse pinning layer 68. The transverse pinned layer structure 70 is formed of two ferromagnetic films 80 and 82, here both depicted as Co—Fe films, separated by a ruthenium (Ru) spacer layer 84. The two ferromagnetic films 80 and 82 are strongly antiparallel exchange-coupled across the ruthenium spacer layer 84. The lower ferromagnetic film 80 adjacent to the transverse pinning layer 68 is sometimes termed the keeper layer, and the upper ferromagnetic film 82 is sometimes termed the reference layer.

The selection of the material of the spacer layer 64 determines the nature of the sensor operation, for example as a giant magnetoresistance (GMR) sensor or a tunnel magnetoresistance (TMR) sensor. For example, a Cu—O spacer layer 64 is used in a GMR sensor. Details of these MR sensors will be discussed subsequently. The present invention is not limited to a particular structure of the MR sensor 50, except for the requirements set forth herein. The present invention is concerned with achieving particular pinning approaches and not with the other details of the structures of the MR sensors 50.

The sensing stack 66 comprises one or more ferromagnetic films. In the illustrated embodiment, the sensing stack 66 has a lower sensing layer 86 of Co—Fe overlying the spacer layer 64 and an upper sensing layer 88 of Ni—Fe overlying the lower sensing layer 86. The sensing stack 66 is longitudinally biased by the longitudinal biasing stack 72 to achieve sensor stability.

The decoupling layer 90 overlies the sensing stack 66. The decoupling layer 90 serves as a cap layer to protect the sensor structure during the first anneal. The decoupling layer 90 provides exchange decoupling between the sensing stack 66 and the longitudinal pinned layer 74 to avoid magnetic stiffness of the sensing stack 66. The decoupling layer 90 is made of an insulating film, such as Al—O, $SiO_2$, or TaO, preferably Al—O, in order to prevent shunting of sensing current to the longitudinal biasing stack 72. The decoupling layer 90 thus physically, magnetically, and electrically separates the remainder of the GMR sensor 52 from the longitudinal biasing stack 72.

The longitudinal biasing stack 72 overlies the decoupling layer 90. The magnetic moments in the longitudinal pinning layer 76 are aligned alternatively in directions parallel to and antiparallel to the longitudinal direction 58, so that there is no net magnetization in the longitudinal pinning layer 76. The longitudinal pinning layer 76 exchange couples to the longitudinal pinned layer structure 74, which is preferably Co—Fe, inducing a rigid pinning of its magnetic moment $M_4$ in the longitudinal direction 58. The longitudinal pinning layer 76 is made of an antiferromagnetic film of Pt—Mn or Ni—Mn, with Pt—Mn preferred, of approximately equiatomic composition. The longitudinal pinning layer 76 is preferably made of the same material as the transverse pinning layer 68.

Figure 7:
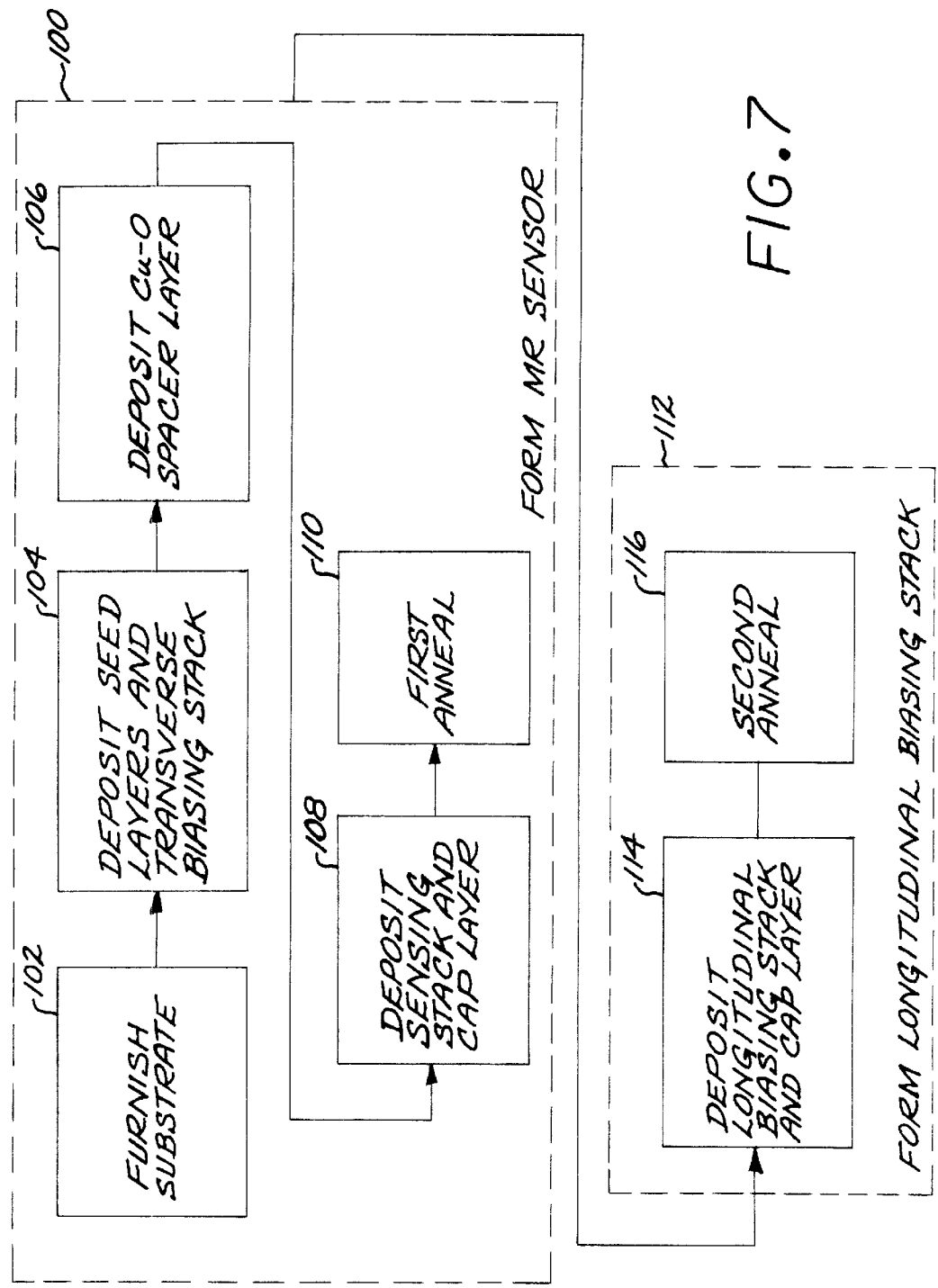
FIG. 7 is a block flow diagram of a method for fabricating the magnetoresistance sensor overlaid with a longitudinal biasing stack in the read region.

FIG. 7 illustrates in block diagram form a method for fabricating the MR sensor structure 50. The prior discussion of details of the component elements is incorporated here. The magnetoresistance sensor 52 is formed, numeral 100, by first furnishing the substrate 60, numeral 102. The seed layers 78 and transverse biasing stack 62 are deposited overlying the substrate 60, numeral 104. The spacer layer 64 is deposited overlying the transverse biasing stack 62, numeral 106. The sensing stack 66 and the decoupling (cap) layer 90 are deposited overlying the spacer layer 64, numeral 108. These deposited films that together form the MR sensor 52 are first annealed in a transverse first applied magnetic field for a first annealing time and at a first annealing temperature to develop antiferromagnetism in the transverse pinning layer 68, numeral 110, thereby rigidly pinning the magnetizations of the transverse pinned layer structure 70.

The longitudinal biasing stack 72 and the cap layer 92 are thereafter formed overlying the MR sensor 52, numeral 112. The forming step 112 includes depositing the longitudinal biasing stack 72 and the cap layer 92, numeral 114. The magnetoresistance sensor 52, the longitudinal biasing stack 72, and the cap layer 92 are thereafter second annealed in a longitudinal second applied magnetic field for a second annealing time and at a second annealing temperature that are sufficient to develop antiferromagnetism in the longitudinal pinning layer 76, thereby rigidly pinning the magnetization of the longitudinal pinned layer 74 in the longitudinal direction 58. The longitudinal second applied magnetic field is relatively lower than the transverse first applied magnetic field, so that the magnetizations of the transverse pinned layer structure 70 are not disrupted.

Care is taken to conduct the step of second anneal 116 so as not to disrupt the magnetizations of the transverse pinned layer structure 70, which were previously established during the first anneal 110. The magnetizations of the transverse pinned layer structure 70 may be disrupted by too high a second annealing temperature, too high a longitudinal second applied magnetic field, or too long a second annealing time. The second annealing temperature is preferably less than the first annealing temperature so that the magnetizations of the transverse pinned layer structure 70 are not disrupted by any thermally activated process. In the first annealing step 110, the transverse first applied magnetic field is greater than a saturation field of antiparallel exchange coupling across the ruthenium spacer layer 84. In the second annealing step 116, the longitudinal magnetic field is greater than a uniaxial anisotropy field of the ferromagnetic film in the longitudinal biasing stack 72, that is not pinned yet after deposition, but less than the spin-flop fields of antiparallel exchange coupling across the ruthenium spacer layer 84. The second annealing temperature is preferably less than the first annealing temperature. The lower second annealing temperature and longitudinal second applied magnetic field achieve the rigid pinning of the magnetization of the longitudinal pinned layer 74 but do not disrupt the previously established rigid pinning of the magnetizations of the transverse pinned layer structure 70.

The use of Pt—Mn as both the transverse pinning layer 68 and the longitudinal pinning layer 76 is particularly amenable to this fabrication process. The first anneal 110 is preferably performed at the first annealing temperature of 280° C. for 2 hours in the transverse first applied magnetic field of about 10 kOe (kilo-Oersteds). The transverse first applied magnetic field is greater than the saturation fields of antiparallel exchange coupling across the ruthenium spacer layer 84, to ensure a complete alignment of the magnetizations of the lower ferromagnetic film (keeper layer) 80 and the upper ferromagnetic film (reference layer) 82 in the transverse direction 56. These saturation fields are typically greater than about 6 kOe. After the first anneal 110, the magnetization of the lower ferromagnetic film 80 remains in the transverse direction 56, while the magnetization of the upper ferromagnetic film 82 rotates by 180 degrees toward a direction antiparallel to the transverse direction 56. This rotation occurs due to the strong antiparallel exchange coupling across the ruthenium spacer layer 84.

The second anneal 116 (when using the Pt—Mn films) is preferably performed at the second annealing temperature of 240° C. for 4 hours in the longitudinal second applied magnetic field of about 200 Oe (Oersteds). The longitudinal second applied magnetic field of the second anneal 116 need only be greater than the uniaxial anisotropy field of the ferromagnetic longitudinal pinned layer 74 in the longitudinal biasing stack 72, which is typically about 10 Oe. The longitudinal second applied magnetic field may be this low because in the longitudinal biasing stack 72 the ferromagnetic longitudinal pinned layer 74 does not exchange couple to the initially nonmagnetic Pt—Mn longitudinal pinning layer 76 after deposition 114 but before the second annealing step 116. The longitudinal second applied magnetic field is less than the spin-flop fields of antiparallel exchange coupling across the ruthenium spacer layer 84, which is typically about 1 kOe. After the second annealing step 116, the Pt—Mn longitudinal pinning layer 76 becomes antiferromagnetic, resulting in strong exchange coupling between the longitudinal pinned layer 74 and the longitudinal pinning layer 76.

The invention may be practiced to produce a giant magnetoresistance (GMR) sensor and a tunnel magnetoresistance (TMR) sensor, as respectively described in the following Examples 1 and 2.

EXAMPLE 1

Figure 8:
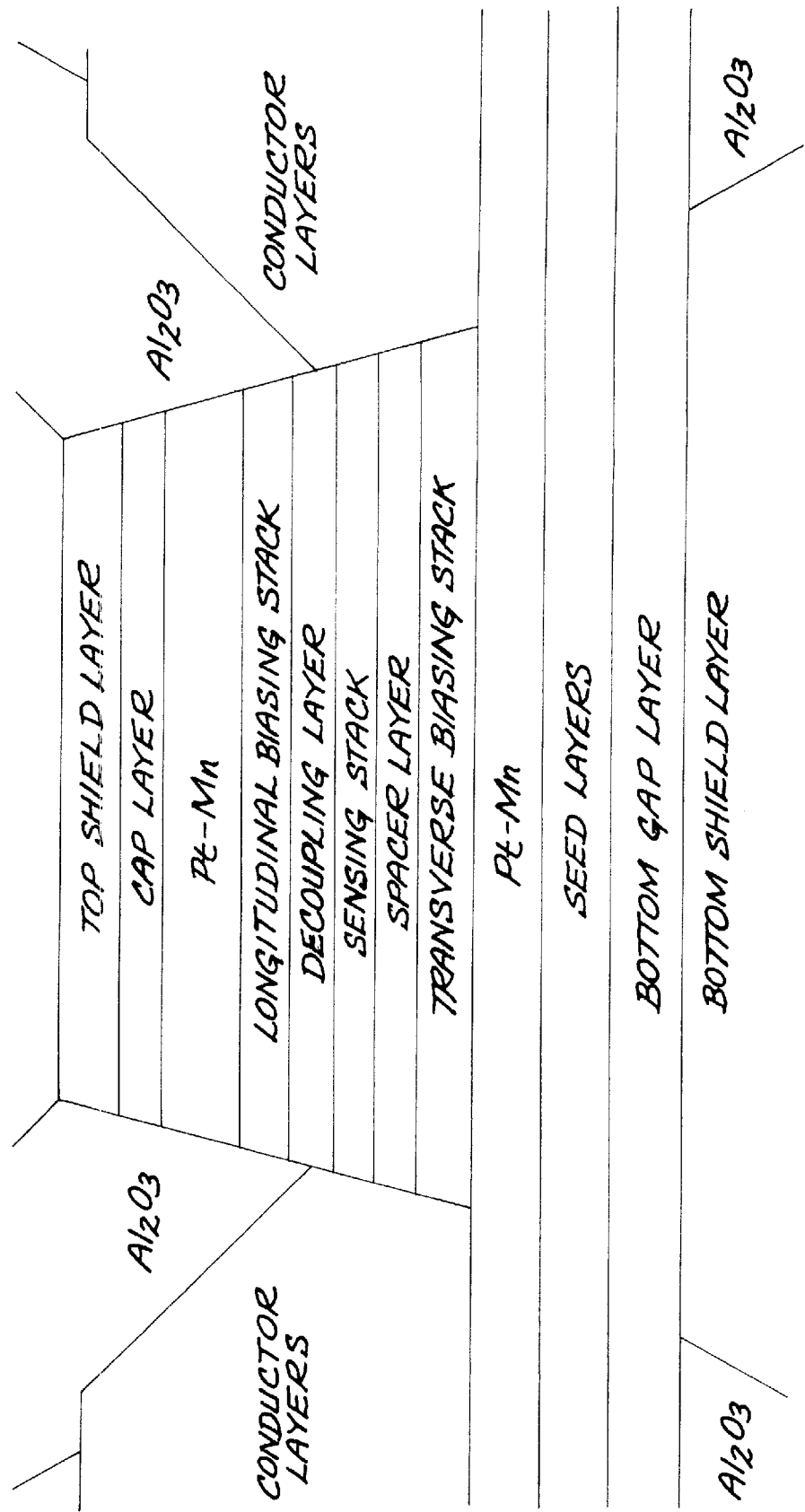
FIG. 8 is a schematic diagram of a GMR sensor with Pt—Mn transverse pinning and longitudinal pinning layers in the read region.

FIG. 8 depicts a GMR sensor with a Pt—Mn transverse pinning layer 68 and a Pt—Mn longitudinal pinning layer 76, and its fabrication process is described in this Example 1. The read gap thickness is designed to be 60 nanometers for magnetic recording at 30 Gb/in$^2$ or higher. The GMR sensor 52 comprises the Al$_2$O$_3$(3)/Ni—Cr—Fe(3)/Ni—Fe(1) seed layers 78, the Pt—Mn(16) transverse pinning layer 68, the Co—Fe(1.6)/Ru(0.8)/Co—Fe(2) transverse pinned layer structure 70, the Cu—O(2.2) spacer layer 64, and the Co—Fe(0.9)/Ni—Fe(1.7) sensing stack 66, and the Al—O(3) decoupling layer 90. (Following a standard convention, the number in parentheses after each layer material is its preferred thickness in nanometers.) In order to attain high signal sensitivity, the area magnetic moment (m$_1$) of the sensing layers 86 and 88 is designed to be as small as 0.24 memu/cm$^2$. To minimize demagnetizing fields, the net areal magnetic moment of the lower ferromagnetic film (reference layer) 80 and upper ferromagnetic film (keeper layer) 82, (m$_2$-m$_3$), is designed to be as small as 0.06 memu/cm$^2$. The longitudinal biasing stack 72 comprises the Co—Fe(2.8)/Pt—Mn(16) films, which is protected by the Al—O(3) cap layer 92. To ensure the formation of a flux closure across the 3 nanometer thick Al—O decoupling layer, the areal magnetic moment of the Co—Fe longitudinal pinning layer (m$_4$) is designed to be 0.36 memu/cm$^2$.

In the fabrication process, a 1 micrometer thick Ni—Fe bottom shield layer is deposited using DC magnetron or ion beam sputtering on an Al$_2$O$_3$—TiO wafer that has been coated with about 6 micrometers of Al$_2$O$_3$ and 1 micrometer of Ni—Fe. Bilayer photoresists are applied and exposed in a photolithographic tool to mask a region where the GMR sensor will be fabricated, and then developed in a solvent to form an undercut. The Ni—Fe bottom shield layer in the unmasked regions is partially removed by ion milling, and then a 60 nanometer thick Al$_2$O$_3$ film is deposited in the ion-milled regions. After photoresist liftoff, chemical mechanical polishing (CMP) is applied to the wafer for the planarization of the embedded Al$_2$O$_3$ film in the Ni—Fe bottom shield layer. A 3 nanometer thick Al—O bottom gap layer is deposited with a deposition/in situ oxidation process. In this deposition/in situ oxidation process, an aluminum film about 1 nanometer thick is deposited in an argon gas atmosphere of 3 mTorr pressure and then in situ oxidized in an oxygen gas atmosphere of 2 Torr pressure for 16 minutes. This deposition/in situ oxidation process is repeated three times in order to attain the designed 3 nanometer film thickness. The oxidation pressure may be higher and the oxidation time longer, to attain a high breakdown voltage which is needed to ensure that there is no electrical shorting between the GMR sensor and the bottom shield layer.

The GMR sensor is then deposited on the bottom gap layer in a longitudinal direction parallel to an alignment mark in an integrated ion beam/DC magnetron sputtering system. The alignment mark is parallel to the ABS 46 after the read/write head fabrication process.

The Al$_2$O$_3$ seed layer is deposited with reactive pulsed-DC magnetron sputtering from a pure aluminum target in mixed argon and oxygen gases of 2.25 and 0.745 mTorr pressure, respectively. The Ni—Cr—Fe and Ni—Fe seed layers are deposited using ion beam sputtering in a xenon gas of 0.12 mTorr pressure. These multiple seed layers provide an in situ flat surface with a strong face-centered-cubic (fcc) (111) crystalline texture and coarse polycrystalline grains, so that all the metallic films of the GMR sensor may grow epitaxially and exhibit a high GMR coefficient.

The Pt—Mn/Co—Fe/Ru/Co—Fe/Cu—O/Co—Fe/Ni—Fe/Al—O films are then sequentially deposited using DC magnetron sputtering in a magnetic field of 40 Oe parallel to the alignment mark. All of the metallic films except the Cu—O and Al—O films are deposited in argon gas of 3 mTorr pressure. The Cu—O spacer layer is formed by depositing a Cu film in mixed argon and oxygen gases of 2.985 and 0.015 mTorr pressure, respectively, and then in situ oxidizing the Cu film for 4 minutes in mixed argon and oxygen gases of 2.94 and 0.06 mTorr pressure, respectively. The Al—O decoupling layer is formed with the same deposition/in situ oxidation process used for the Al—O bottom gap layer.

After these depositions, the wafer is annealed with a transverse first applied magnetic field of 10 kOe for 2 hours at a first annealing temperature of 280° C. in a transverse direction perpendicular to the alignment mark in a high-vacuum oven. After this transverse field annealing, the Co—Fe(2.8)/Pt—Mn(16) films, a 3 nanometer thick Al—O cap layer 92, and a 6 nanometer thick Ni—Fe film (to be used as an adhesion layer for subsequent photoresist patterning processes) are deposited. The metallic films are deposited using DC magnetron sputtering in argon gas of 3 mTorr pressure. The Al—O cap layer 92 is formed with the same deposition/in situ process used in depositing the Al—O bottom gap layer. The wafer is annealed again, with a longitudinal second applied magnetic field of 200 Oe for 6 hours at a second annealing temperature of 240° C. in a longitudinal direction parallel to the alignment mark in the high-vacuum oven.

After the longitudinal-field annealing, bilayer photoresists are applied and exposed in a photolithographic tool to mask the GMR sensor 52, the longitudinal biasing stack 72, and the Al—O/Ni—Fe films in the read region, and then developed in a solvent to form an undercut. The GMR sensor 52, the longitudinal biasing stack 72, and the Al—O/Ni—Fe films in unmasked side regions are removed by ion milling until the Pt—Mn film is exposed, and then Ta(3)/Au(75)/Ta(15) films are immediately deposited. The bilayer photoresists are lifted off, and 20 nanometer thick Al$_2$O$_3$ films are deposited with DC magnetron or ion beam sputtering to cover the entire GMR sensor structure. CMP is then applied to the wafer until the NiFe adhesion layer and the Ta film are exposed in the read and side regions, respectively. Bilayer photoresists are applied and exposed in a photolithographic tool to mask the read region, and then developed in a solvent to form an undercut. Ta(3)/Cu(75)/Ta(15)/Al$_2$O$_3$(30) films are then deposited overlying the Ta/Au/Ta films in the unmasked side regions. After photoresist liftoff, the flat surface produced by CMP still remains in the read region. A 1-micrometer thick Ni—Fe film used as a top shield layer is deposited on the wafer and a write head is fabricated. The Ni—Fe adhesion layer may partially remain over the Al—O cap layer, as a small portion of the top shield layer.

The GMR sensor requires transverse-field annealing for the transformation in the Pt—Mn film from a nonmagnetic face-centered-cubic (fcc) phase to an antiferromagnetic face-centered-tetragonal (fct) phase. Before annealing, only antiparallel exchange coupling occurs across the Ru spacer layer, and thus the magnetization and magnetoresistance of the GMR sensor exhibits symmetrical responses to external magnetic fields (H$_{SF2}$=H$_{SF3}$=1090 Oe and H$_{S2}$=H$_{S3}$=7162 Oe). H$_{SF3}$ and H$_{S3}$ are respectively defined as the spin-flop and saturation fields of the keeper layer 80 and are measured when applying a field against the magnetization of the keeper layer 80 (M$_3$). H$_{SF2}$ and H$_{S2}$ are respectively defined as the spin-flop and saturation fields of the reference layer 82, and are measured when applying a field against the magnetization of the reference layer 82 (M$_2$). After transverse-field annealing, parallel exchange coupling occurs between the Pt—Mn transverse pinning layer 68 and the Co—Fe lower ferromagnetic film (keeper layer) 80, and parallel or antiparallel coupling also occurs across the Cu—O spacer layer 64. As a result, the magnetization and magnetoresistance responses become asymmetrical.

Figure 9:
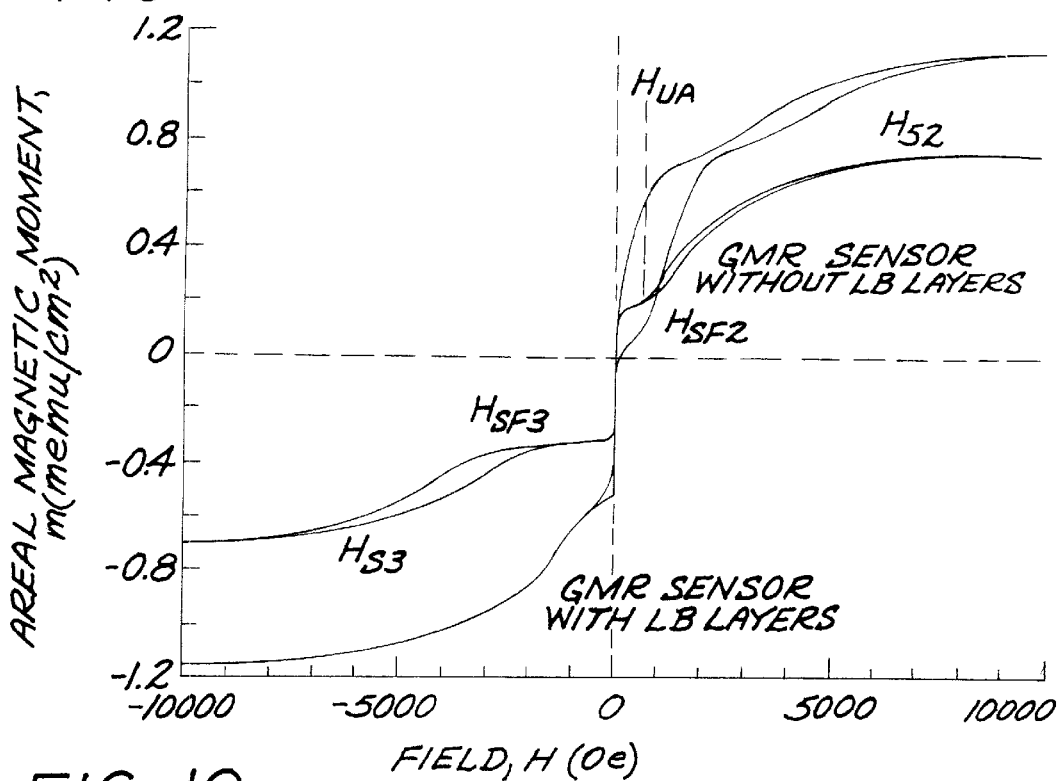
FIG. 9 illustrates the asymmetrical magnetization responses of the GMR sensor with and without the Co—Fe/Pt—Mn longitudinal biasing stack after first annealing for 2 hours at 280° C. in a field of 10 kOe parallel to the easy axis of the sensing, keeper, and reference layers, and second annealing for 6 hours at 240° C. in a field of 10 kOe parallel to the easy axis.

FIG. 9 illustrates the asymmetrical magnetization responses of the GMR sensor with and without the Co—Fe/Pt—Mn longitudinal biasing stack 72 after the alternative deposition/annealing processes as previously described (FIG. 7). However, for ease in the determination of basic properties, both annealing steps are performed in a direction parallel to the easy axis of the sensing stack 66, and the magnetoresistance responses are also measured in the same direction. The $H_{SF2}$, $H_{S2}$, $H_{SF3}$, and $H_{S3}$ labeled in this FIG. 9 are 1.2, 6.2, 4.0, and 7.4 kOe, respectively. For this typical GMR sensor, the transverse first applied magnetic filed used for the first annealing preferably ranges from about 7.5 to about 15 kOe, and the longitudinal second magnetic field used in the second annealing preferably ranges from about 10 to about 1000 Oe. The unidirectional anisotropy field $H_{UA}$ produced from exchange coupling between the Co—Fe and Pt—Mn films is about 680 Oe, indicating very rigid pinning between the Co—Fe and Pt—Mn films.

Figure 10:
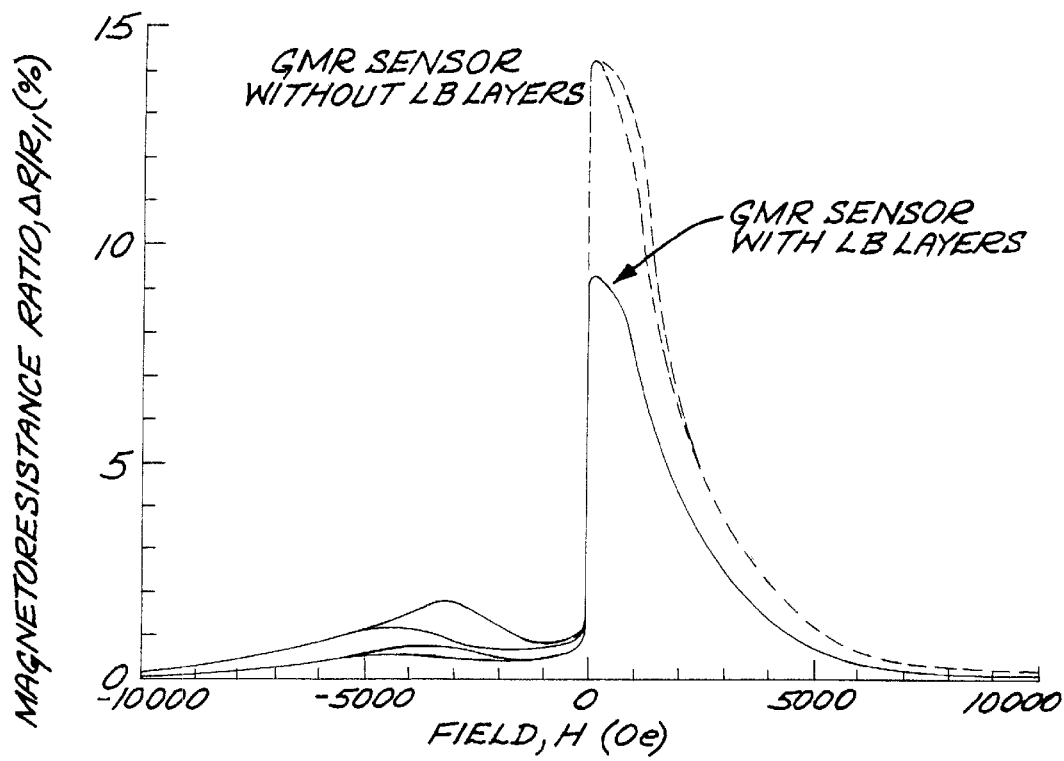
FIG. 10 illustrates the asymmetrical magnetoresistance responses of the GMR sensor with and without the Co—Fe/Pt—Mn longitudinal biasing stack after first annealing for 2 hours at 280° C. in a field of 10 kOe parallel to the easy axis of the sensing, keeper, and reference layers, and second annealing for 6 hours at 240° C. in a field of 10 kOe parallel to the easy axis.

FIG. 10 illustrates the asymmetrical magnetoresistance responses of the GMR sensor with and without the Co—Fe/Pt—Mn longitudinal biasing stack 72 after the alternative deposition/annealing processes as previously described (FIG. 7). The GMR sensor without the longitudinal biasing stack exhibits a high sensor resistance $R_\parallel$ (19.3 ohms per square), a high GMR coefficient $\Delta R_G/R_\parallel$ (14.2 percent), and a negative ferromagnetic coupling field $H_F$ (−3.4 Oe), indicating antiparallel coupling across the Cu—O spacer layer, and very high spin flop and saturation fields. The GMR sensor with the longitudinal biasing stack exhibits lower $R_\parallel$ (13.9 ohms per square), lower $\Delta R_G/R_\parallel$ (9.2 percent), and unchanged $H_F$ (−1.5 Oe), indicating no additional exchange coupling across the Al—O decoupling layer, and as well as nearly unchanged spin flop and saturation fields. These experimental results indicate that, to prevent decreases in both $R_\parallel$ and $\Delta R_G/R_\parallel$, shunting of the sensing current into the longitudinal biasing stack 72 must be eliminated.

Figure 11:
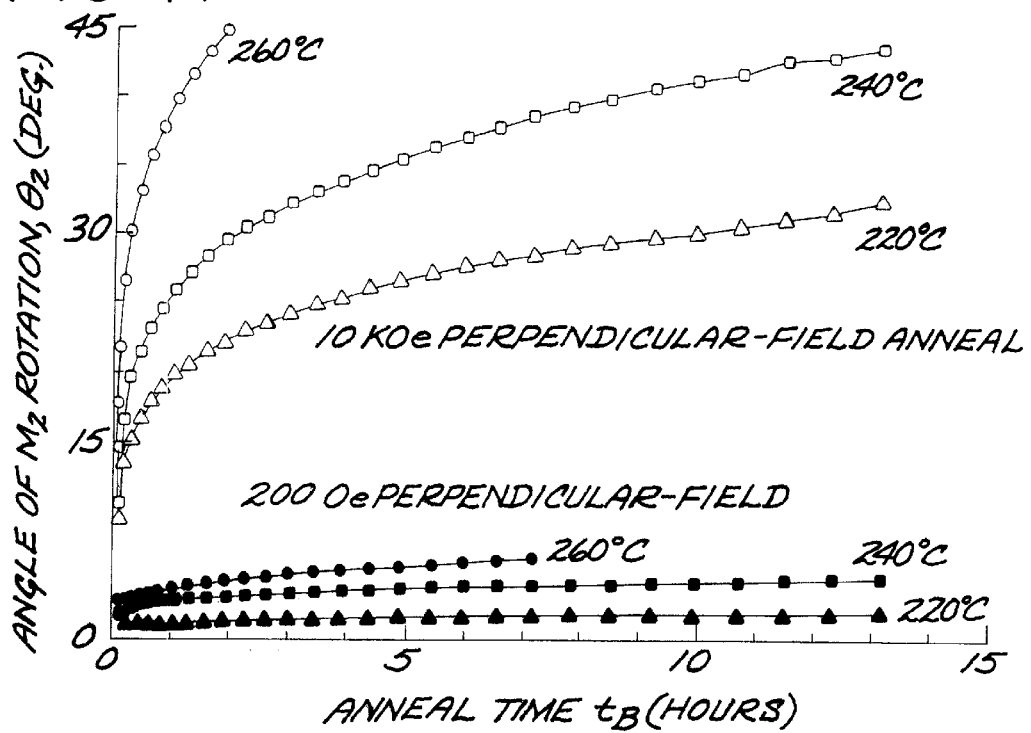
FIG. 11 illustrates $\theta_2$ as functions of annealing temperature and time for the GMR sensor annealed in a field of 10 kOe parallel to the easy axis of the sensing, keeper, and reference layers, and then annealed again in a field of 200 Oe or 10 kOe perpendicular to the easy axis.

FIG. 11 shows the $M_2$ rotation angle ($\theta_2$) as functions of annealing temperature and time for the GMR sensor annealed in a field of 10 kOe parallel to the easy axis of the sensing stack 66, and then annealed again in a field of 200 Oe or 10 kOe perpendicular to the easy axis. After cooling to 30° C. in the field, $\theta_2$ is determined from the asymmetry of the hard-axis magnetoresistance responses of the GMR sensor. After annealing in 200 Oe for 13.2 hours at 220 and 240° C., $M_2$ is rotated by only 2 degrees and 4.6 degrees, respectively. However, after annealing in a perpendicular field of 10 kOe for 13.2 hours at 220 and 240° C., $M_2$ is rotated by as much as 32.3 and 43.6 degrees, respectively. These experimental results indicate that the second anneal in a field of 200 Oe parallel to the air bearing surface (ABS) for up to 13.2 hours at 240° C. may also be applied to the Co—Fe/Pt—Mn films to develop exchange coupling, without substantially rotating $M_2$ from its preferred transverse direction perpendicular to the air bearing surface (ABS).

Figure 12:
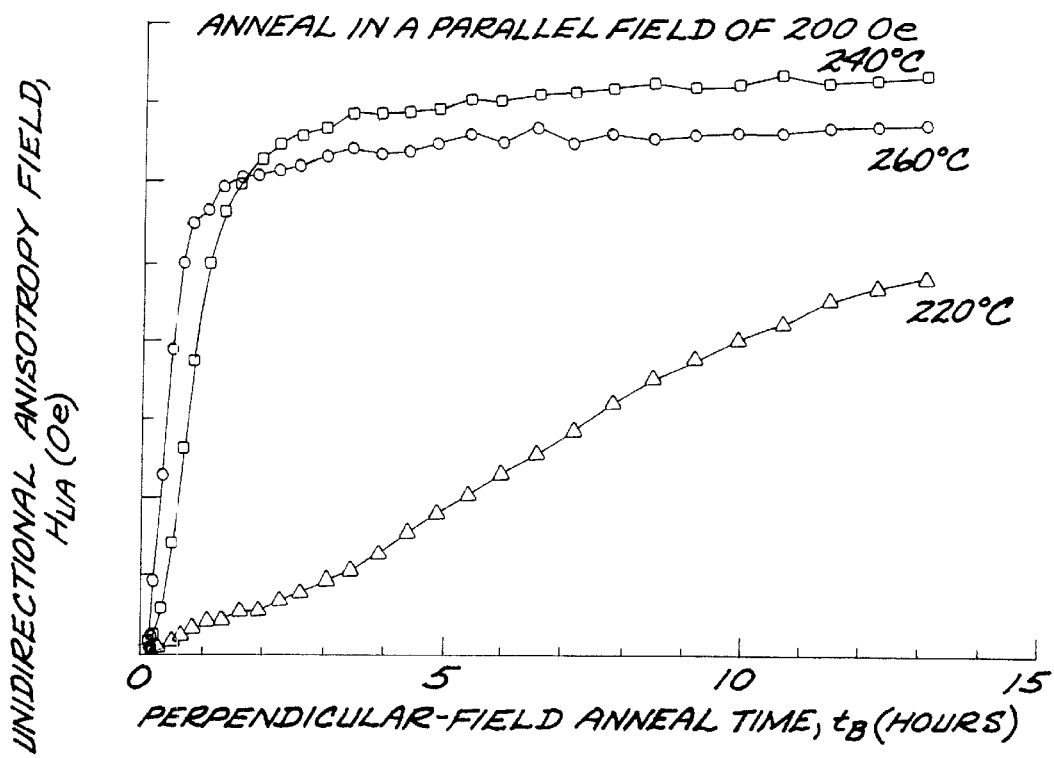
FIG. 12 shows $H_{UA}$ as functions of annealing temperature and time for Co—Fe/Pt—Mn films annealed in a magnetic field of 200 kOe parallel to the easy axis of the Co—Fe film.

FIG. 12 shows $H_{UA}$ as functions of annealing temperature and time for Co—Fe/Pt—Mn films annealed in a magnetic field of 200 Oe parallel to the easy axis of the Co—Fe film. $H_{UA}$ reaches a reasonably high value needed for sensor stability. This $H_{UA}$ value depends upon the annealing temperature and time, but does not depend upon the magnetic field at all. Hence, the use of the low magnetic field during the second annealing has no detrimental effects on $H_{UA}$. In addition to the development of exchange coupling for the longitudinal biasing stack, the second annealing also thermally resets the magnetization of the sensing layers $M_1$ to the preferred longitudinal direction. As a result, $M_2$ and $M_3$ stay in their preferred directions perpendicular to the air bearing surface (AB S), while $M_1$ and $M_4$ stay in their preferred longitudinal direction, without any thermal interruptions, in the subsequent write head fabrication process.

The fabrication process of the GMR sensor with the transverse pinning layer 68 and the longitudinal pinning layer 76 provides several unique features, including the in situ protection of the bottom gap layer, the precise control of both physical and magnetic sensor widths, simple electrical connection, no need for the top gap layer, and the planarization of the sensor structure in the read region. The bottom gap layer is in situ protected since it is in situ deposited and immediately in situ protected by the seed layers, and is not exposed at all during ion milling. The physical sensor width is precisely controlled since the sensing layers are very well defined by photolithographic patterning and ion milling. The magnetic sensor width is precisely controlled since unwanted magnetic domain activities are totally eliminated at two sensor edges. Electrical connection becomes very simple since only conductor layers are needed in the side regions and all the complicated concerns on the degradation of the longitudinal biasing stack in the side regions are eliminated. The top gap layer is not needed as long as the Al—O decoupling layer is so insulating that the sensing current will not flow from the GMR sensor to the longitudinal basing stack, and the conductor layers do not contact the longitudinal biasing stack. The GMR structure in the read region is planarized with CMP, providing a flat surface for conducting the write head fabrication process.

The Co—Fe/Pt—Mn films 72 as applied to the GMR sensor in the read region play a key role in improving sensor stability, increasing signal sensitivity, increasing read efficiency, and eliminating side reading. The sensor stability is improved due to magnetostatic interactions between $M_1$ and $M_4$, which form a flux closure after ion milling is applied to the GMR sensor and the Co—Fe/Pt—Mn films. The signal sensitivity is increased because $M_4$ need only be 1.5 times $M_1$ for sensor stability, instead of more than 6 times $M_1$ for the Co—Pt—Cr film abutting edges of the GMR sensor. The read efficiency is increased because stray fields, which stem from the Co—Pt—Cr film do not exist in this Example 1. As a result, stray-field induced sensor stiffness at the sensor edges is substantially reduced. Side reading is eliminated since the sensing and Co—Fe/Pt—Mn films are only confined in the read region, instead of abutting each other at the sensor edges and leaving unstable magnetic domains at the abutted junctions when the Co—Pt—Cr longitudinal pinning layer is used. Hence, the Co—Fe/Pt—Mn films play a more crucial role as the lateral extent of the GMR sensor is made ever-smaller.

Figure 3:
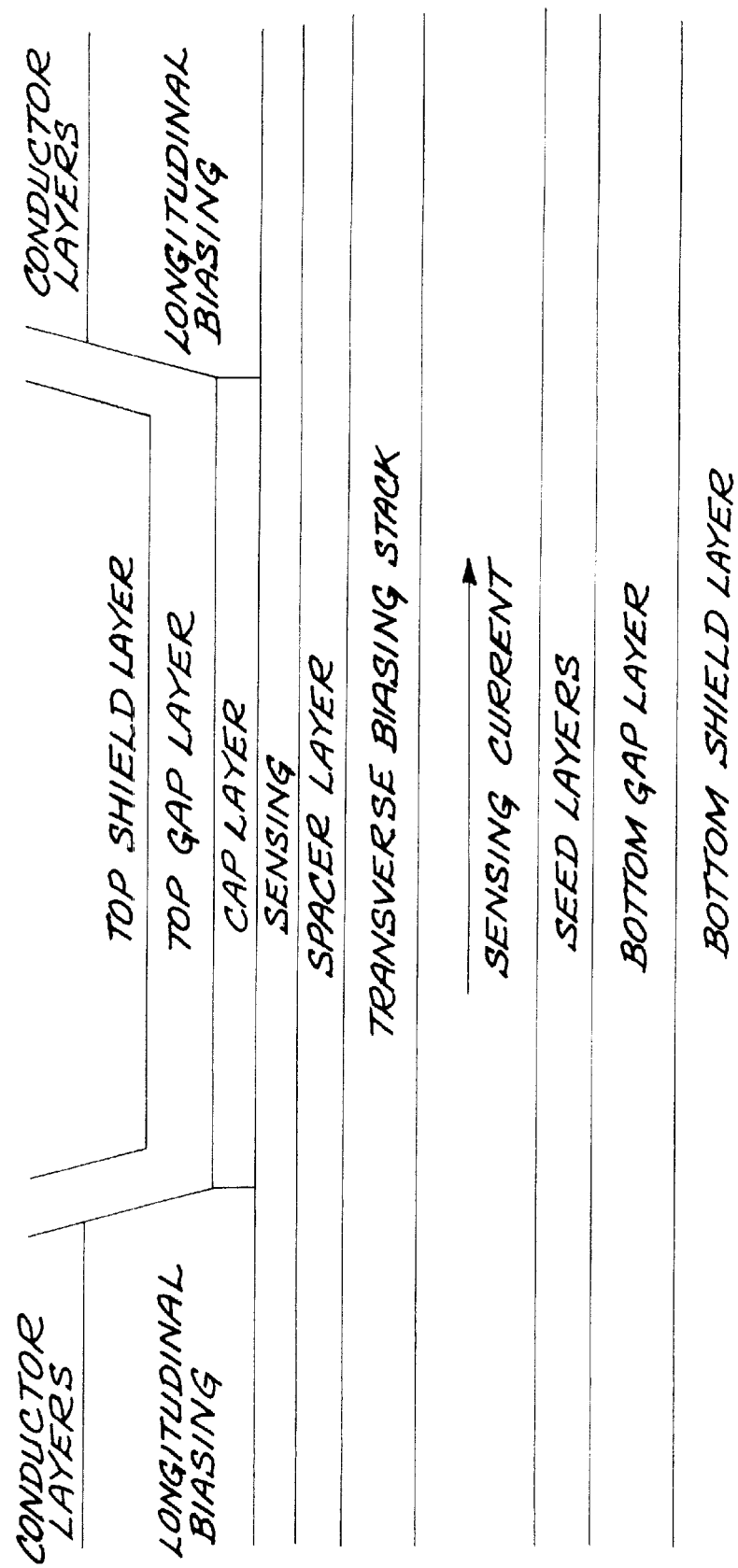
FIG. 3 is a schematic diagram of a giant magnetoresistance sensor with a Pt—Mn transverse pinning layer in the read region and with an Ir—Mn longitudinal biasing structure in the two side regions.

The Co—Fe/Pt—Mn films may also be used in conjunction with the GMR sensor structures shown in FIGS. 2 and 3. The thus-modified GMR sensor structures have the advantage of less concern with electrical shorting between the GMR sensor and the shield layers, since without the Co—Fe/Pt—Mn films in the read regions the top and bottom gap layers may be thicker. The major disadvantages of this other approach, such as the strong sensor stiffness caused by stray fields stemming from the Co—Pt—Cr film and the low corrosion resistance of the Ir—Mn film, may be eliminated when the Cr/Co—Pt—Cr and Co—Fe/Ir—Mn films in the side regions are replaced by the Co—Fe/Pt—Mn films. However, to maximize advantages on the fabrication process and the read performance, the Co—Fe/Pt—Mn films are preferably used overlying the GMR sensor in the read region such as shown in FIG. 8.

Figure 13:
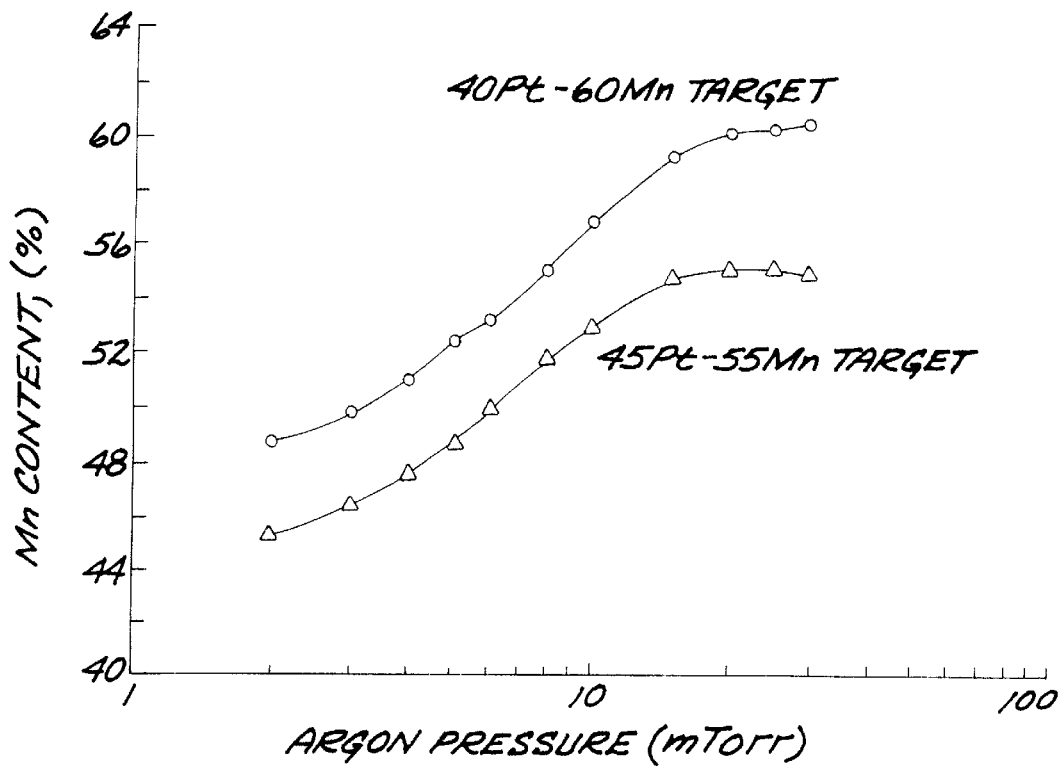
FIG. 13 illustrates the Mn content as a function of the argon pressure for Pt—Mn films.
Figure 14:
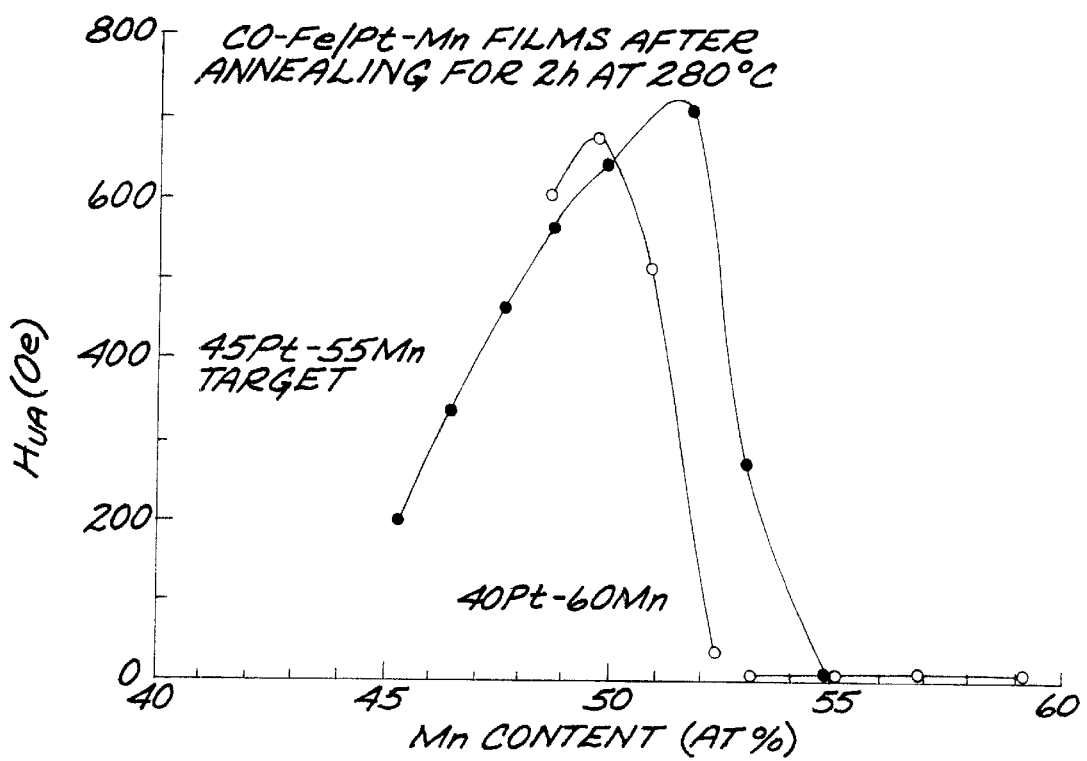
FIG. 14 shows $H_{UA}$ as a function of the manganese content for Co—Fe/Pt—Mn films annealed in a field of 10 kOe for 2 hours at 280° C.

To ensure the viable use of the Co—Fe/Pt—Mn films 72 without interrupting the optimal sensor operation, it is preferred to anneal the Co—Fe/Pt—Mn films for shorter time at lower temperature, and still attain an $H_{UA}$ as high as possible. This may only be achieved when the manganese content in the Pt—Mn is carefully selected. FIG. 13 shows the manganese content versus the argon pressure for Pt—Mn films deposited with DC magnetron sputtering from 45Pt—55Mn and 40Pt—60Mn targets (composition in atomic percent). The Pt—Mn film deposited in low argon pressures has a manganese content lower by almost 10 atomic percent than the Pt—Mn target. Only when it is deposited in high argon pressures, its manganese content is nearly equivalent to that of the Pt—Mn target. FIG. 14 shows $H_{UA}$ versus the manganese content for Co—Fe(2.8)/Pt—Mn(20) films annealed in a field of 10 kOe for 2 hours at 280° C. It is found that the composition range for a high $H_{UA}$ is very narrow, and the highest $H_{UA}$ may only be attained when the manganese content is very well controlled to be around 50 atomic percent. As shown in FIGS. 13 and 14, to attain this preferred manganese content and a high $H_{UA}$, the Pt—Mn films must be deposited with DC magnetron sputtering in an argon pressure of either 8 mTorr from the 45PT—55Mn target, or 3 mTorr from the 40Pt—60Mn target.

To ensure the viable use of the Co—Fe/Pt—Mn films 72 over the GMR sensor 52, it is important to select an insulating film, such as Al—O, $SiO_2$, Ta—O, etc. as a decoupling layer 90 to prevent shunting of sensing current into the Co—Fe/Pt—Mn films, and it is also important to precisely control the thickness of the decoupling layer, which may slightly increase when the decoupling layer is exposed to air and annealed in the high-vacuum oven. In this Example 1, to prevent this uncertain, slight thickness increase at the ex situ surface of the Al—O decoupling layer, the GMR sensor, the Al—O decoupling layer, and Co—Fe (2.8)/Ta(3) films may be deposited together. After the transverse-field annealing, the Ta cap layer is removed, the Co—Fe film is slightly sputter etched, and then the Co—Fe (1)/Pt—Mn(16)/Al—O(3) films are deposited. The slight sputter etching is optimized to ensure exchange coupling at the ex situ interface between the first and second deposited Co—Fe films, and to ensure a good control of their magnetic moments. Alternatively, the GMR sensor, the Al—O decoupling layer, and the Co—Fe(2.8)/Pt—Mn(5)/Ta(3) films may be deposited together. After the transverse field annealing, the Ta cap layer is removed, the Pt—Mn film is slightly sputter etched, and then the Pt—Mn(12)/Al—O(3) films are deposited. The first deposited Pt—Mn film must be as thin as possible so that neither $H_{UA}$ or coercivity of more than 50 Oe is attained from the Co—Fe/Pt—Mn films. The slight sputter etching is optimized to ensure good exchange coupling at an ex situ interface between the first- and second-deposited Pt—Mn films for attaining a high $H_{UA}$ after the longitudinal-field annealing. In this Co—Fe/Co—Fe and Pt—Mn/Pt—Mn "stitching" process, the Al—O decoupling layer is in situ protected, and thus its thickness may be accurately controlled.

A Ni—Mn film can also be used to replace either the Pt—Mn transverse pinning layer 68 or the Pt—Mn longitudinal pinning layer 76. The Ni—Mn film requires annealing for a longer time at higher temperatures to attain the highest $H_{UA}$. However, since this $H_{UA}$ is the highest among all available antiferromagnetic films (Ni—Mn, Pt—Mn, Ir—Mn, Pd—Mn, Rh—Mn, Cr—Mn, etc.) it is still feasible to anneal this Ni—Mn film for a shorter time at lower temperatures to attain a reasonably high $H_{UA}$.

EXAMPLE 2

The Co—Fe/Pt—Mn films may also be used for a tunnel magnetoresistance (TMR) sensor in the read region. The fabrication process of a TMR sensor with the Co—Fe/Pt—Mn films in the read region is described in this Example 2. The read gap thickness of this TMR sensor is designed to be 60 nanometers for magnetic recording at 30 $Gb/in^2$ or higher. The TMR sensor comprises Ta(10)/Ni—Fe(1)/Pt—Mn(16)/Co—Fe(1.6)/Ru(0.8)/Co—Fe(2)/Al—O(0.6)/Co—Fe(0.9)/Ni—Fe(1.7)/Ru(3) films. The Ta/Ni—Fe films are seed layers 78, the Pt—Mn film is the transverse pinning layer 68, and the Co—Fe (keeper layer)/Ru/Co—Fe (reference layer) films are the transverse pinned layer structure 70. The Al—O spacer layer 64 is, in this case, a tunnel barrier layer. The sensing stack 66 includes the Co—Fe/Ni—Fe films. The ruthenium film is the decoupling layer 90, which provides exchange decoupling between the sensing layers and the longitudinal biasing stack 72. The ruthenium decoupling layer also acts as a good seed layer for the Co—Fe/Pt—Mn film to exhibit a very high $H_{UA}$ after annealing, and a good conducting layer for sensing current flow in the TMR sensor. The longitudinal biasing stack 72 comprising Co—Fe(2.8)/Pt—Mn(16) films is protected by a Ru(3) cap layer.

In this fabrication process, a 1 micrometer thick Ni—Fe bottom shield layer is deposited using DC magnetron or ion beam sputtering on an $Al_2O_3$-coated wafer. After applying chemical mechanical polishing (CMP) for the planarization of the Ni—Fe bottom shield layer, the TMR sensor is then deposited on the bottom shield layer in a magnetic field of 40 Oe in a longitudinal direction parallel to an alignment mark in an integrated ion beam/DC magnetron sputtering system.

The Ta, Ni—Fe, and Pt—Mn films are deposited using ion beam sputtering in xenon gas of 0.12 mTorr pressure, and the Co—Fe, Ru, Co—Fe, Al—O, Ni—Fe, Co—Fe, Ru, and 3 nanometer thick Ta films are then sequentially deposited using DC magnetron sputtering in a magnetic field of 40 Oe parallel to the alignment mark. The additional Ta film is used as a sacrificial layer for protection from oxygen diffusion into the TMR sensor during annealing. All the metallic films except the Al—O film are deposited in argon gas of 3 mTorr pressure. To form the Al—O film, an Al film is deposited in argon gas of 3 mTorr pressure and then in situ oxidized in oxygen gas of 500 mTorr pressure for 8 minutes. The oxidation pressure is lower and the oxidation time shorter than those described for the in situ oxidation of the GMR sensor, in order to attain a high TMR coefficient and a low junction resistance.

After the depositions, the wafer is annealed with a field of 10 kOe for 2 hours at 280° C. in a transverse direction perpendicular to the alignment mark in a high-vacuum oven. After this transverse-field anneal, the Ta sacrificial layer is completely removed with reactive ion etching (RIE). The Co—Fe(2.8)/Pt—Mn(16) films, a 3 nanometer thick ruthenium film, and a 6 nanometer thick Ni—Fe film are deposited in a magnetic field of 40 Oe parallel to the alignment mark. All of these metallic films are deposited using DC magnetron sputtering in argon gas of 3 mTorr pressure. The wafer is annealed again with a field of 200 Oe for 6 hours at 240° C. in an longitudinal direction parallel to the alignment mark in the high-vacuum oven.

After the longitudinal-field annealing, bilayer photoresists are applied and exposed in a photolithographic tool to mask the TMR sensor and the Co—Fe/Pt—Mn/Ru/Ni—Fe films in the read region, and then developed in a solvent to form an undercut. The TMR sensor and the Co—Fe/Pt—Mn/Ru/Ni—Fe films in the unmasked side regions are removed by ion milling until the Pt—Mn film is exposed, and then 80 nanometer thick $Al_2O_3$ is immediately deposited with DC magnetron or ion beam sputtering. The bilayer photoresists are lifted off, and CMP is then applied to the wafer until the Ni—Fe adhesion layer is exposed for producing a flat surface on wich a 1 micrometer thick Ni—Fe top shield layer is deposited and a write head is fabricated.

Figure 15:
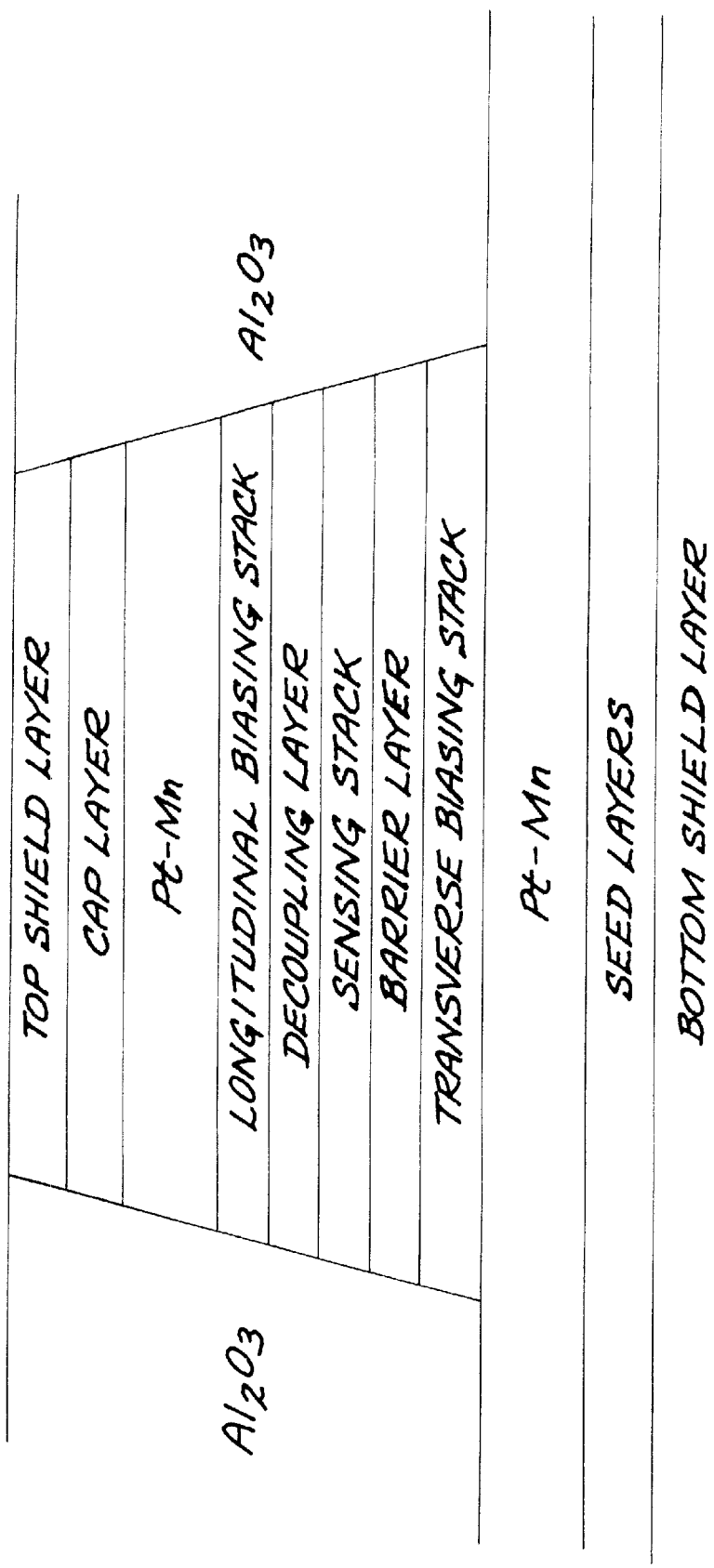
FIG. 15 is a schematic diagram of a TMR sensor with a Pt—Mn transverse pinning layer and a Pt—Mn longitudinal pinning layer in the read region.
Figure 16:
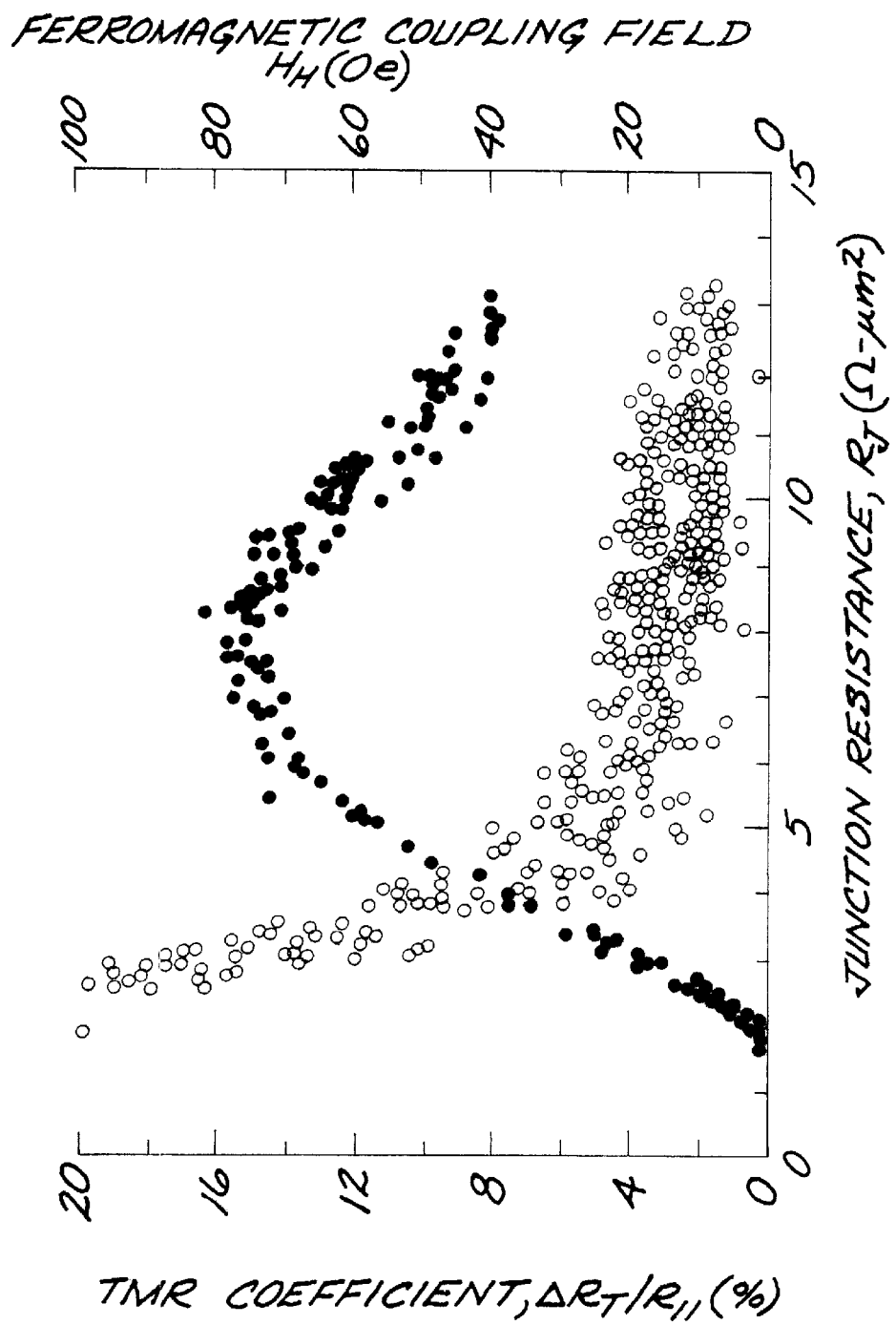
FIG. 16 illustrates the TMR coefficient ($\Delta R_T/R_{\parallel}$) versus the junction resistance ($R_J$) for TMR sensors.

After this fabrication process, the TMR coefficient reaches as high as about 16 percent, and the junction resistance reaches as low as 8 ohm-micrometer$^2$, as shown in FIG. 16. In contrast to the Co—Fe/Pt—Mn films 72 overlying the GMR sensor, the Co—Fe/Pt—Mn films 72 overlying the TMR sensor do not cause current shunting at all and thus have almost no detrimental effects on both the TMR coefficient and the junction resistance. In addition, the Co—Fe/Pt—Mn films 72 cannot be used in the MR sensors of FIGS. 2–3, since insulating films must be located in the side regions to confine the sensing current to flow through the Al—O tunnel barrier layer for exhibiting TMR effects. The TMR sensor structure shown in FIG. 15 is thus not only a preferred sensor structure, but also the only viable sensor structure.

To ensure the viable use of the Co—Fe/Pt—Mn films 72 overlying the TMR sensor, it is important to select a conducting noble-metal film, such as gold, copper, rhenium, ruthenium, etc., as a decoupling layer to ensure flowing of sensing current from the TMR sensor to the Co—Fe/Pt—Mn films to prevent oxidation at its surface exposed to air, and to precisely control the thickness of the decoupling layer. In this Example 2, to ensure the cleanness, conductivity, and precise thickness of the ruthenium decoupling layer, two alternative fabrication processes described in Example 1, one including the "stitching" of the first and second deposited Co—Fe films and the other including the "stitching" of the first and second deposited Pt—Mn films, can also be applied to the TMR sensor. However, when this ruthenium decoupling layer is in situ protected, strong exchange coupling may still occur even if it is thicker than 3 nanometers. Different conducting films may be used to reduce or eliminate the exchange coupling, but they must also be a seed layer as good as the ruthenium film for the Co—Fe/Pt—Mn films to exhibit a high $H_{UA}$ after annealing. Alternatively, two conducting films, such as Cu(1)/Ru(2), can be used as a decoupling layer, so that the decoupling layers may be thin enough to ensure sensor stability through a very well formed flux closure.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A magnetoresistance sensor structure comprising:
   a magnetoresistance sensor having a sensor surface plane, a transverse direction lying in the sensor surface plane, and a longitudinal direction lying perpendicular to the transverse direction and in the sensor surface plane, the magnetoresistance sensor comprising:
      a transverse biasing stack comprising:
         a transverse pinning layer made of a transverse-pinning-layer antiferromagnetic material, and
         a transverse pinned layer structure overlying the transverse pinning layer,
      a spacer layer overlying the transverse pinned layer structure,
      a sensing stack overlying the spacer layer, and
      an electrically insulating decoupling layer overlying the sensing stack; and
   a longitudinal biasing stack overlying the magnetoresistance sensor, the longitudinal biasing stack comprising:
      a longitudinal pinned layer, and
      a longitudinal pinning layer overlying the longitudinal pinned layer and made of a longitudinal-pinning-layer antiferromagnetic material.

2. The magnetoresistance sensor structure of claim 1, further including a seed layer upon which the transverse biasing stack is deposited.

3. The magnetoresistance sensor structure of claim 1, further including a cap layer overlying the longitudinal biasing stack.

4. The magnetoresistance sensor structure of claim 1, wherein the transverse pinned layer structure is rigidly pinned magnetically in the transverse direction by the transverse pinning layer at temperatures of from room temperature to at least 180° C., and
   the longitudinal pinned layer is rigidly pinned magnetically in the longitudinal direction by the longitudinal pinning layer at temperatures of from room temperature to at least 180° C.

5. The magnetoresistance sensor structure of claim 1, wherein the magnetoresistance sensor is a giant magnetoresistance sensor, wherein the spacer layer is electrically conductive.

6. The magnetoresistance sensor structure of claim 1, wherein the magnetoresistance sensor is a tunnel magnetoresistance sensor, wherein the spacer layer is electrically resistive.

7. The magnetoresistance sensor structure of claim 1, wherein the transverse-pinning-layer antiferromagnetic material and the longitudinal-pinning-layer antiferromagnetic material are the same material.

8. The magnetoresistance sensor structure of claim 1, wherein
   the transverse-pinning-layer antiferromagnetic material is selected from the group consisting of Pt—Mn and Ni—Mn, and
   the longitudinal-pinning-layer antiferromagnetic material is selected from the group consisting of Pt—Mn and Ni—Mn.

9. The magrietoresistance sensor structure of claim 1, wherein the transverse-pinning-layer antiferromagnetic material is Pt—Mn, and the longitudinal-pinning-layer antiferromagnetic material is Pt—Mn.

10. The magnetoresistance sensor structure of claim 1, wherein the longitudinal-pinning-layer antiferromagnetic material is selected from the group consisting of Pt—Mn and Ni—Mn.

11. The magnetoresistance sensor structure of claim 1, wherein the longitudinal-pinning-layer antiferromagnetic material is Pt—Mn.

12. The magnetoresistance sensor structure of claim 1, wherein the transverse pinned layer structure includes a pair of ferromagnetic layers separated by an antiparallel coupling layer, wherein the pair of ferromagnetic layers of the transverse pinned layer structure are antiparallel exchange-coupled.

13. The magnetoresistance sensor structure of claim 1, wherein a magnetic moment of the longitudinal biasing stack generally matches a magnetic moment of the sensing stack.

* * * * *